United States Patent
Morris

(10) Patent No.: US 6,184,700 B1
(45) Date of Patent: Feb. 6, 2001

(54) FAIL SAFE BUFFER CAPABLE OF OPERATING WITH A MIXED VOLTAGE CORE

(75) Inventor: Bernard L. Morris, Emmaus, PA (US)

(73) Assignee: Lucent Technologies, Inc., Murray Hill, NJ (US)

(*) Notice: Under 35 U.S.C. 154(b), the term of this patent shall be extended for 0 days.

(21) Appl. No.: 09/318,158

(22) Filed: May 25, 1999

(51) Int. Cl.[7] ............................................. H03K 19/007
(52) U.S. Cl. .............................. 326/14; 326/57; 326/83
(58) Field of Search .................................. 326/56, 57, 58, 326/14, 83, 86, 80, 113

(56) References Cited

U.S. PATENT DOCUMENTS

| 5,160,855 | 11/1992 | Dobberpuhl | 307/270 |
|---|---|---|---|
| 5,446,300 | 8/1995 | Amato et al. | 257/343 |
| 5,576,635 | 11/1996 | Partovi et al. | 326/27 |
| 5,952,866 * | 9/1999 | Kothandaraman et al | 327/333 |
| 5,963,083 * | 9/1999 | Kothandaraman et al | 327/545 |

* cited by examiner

Primary Examiner—Michael Tokar
Assistant Examiner—Daniel D. Chang
(74) Attorney, Agent, or Firm—Synnestvedt & Lechner LLP

(57) ABSTRACT

A voltage blocking circuit is disclosed, useable in a buffer portion of an integrated circuit, for a buffer portion of an IC chip that operates from a power supply different from the power supply that powers the core logic; however, the buffer remains in a high impendence state, regardless of whether or not power is supplied to the core logic.

12 Claims, 6 Drawing Sheets

FAIL SAFE BUFFER CAPABLE OF OPERATING WITH A MIXED VOLTAGE CORE

FIELD OF THE INVENTION

The present invention relates to an integrated circuit (IC) having a fail safe buffer that operates from a power supply different from the power supply that powers the digital core.

DESCRIPTION OF THE RELATED ART

Most IC chips can be divided into two groups of circuits. One group of circuits, called buffers, function to drive and receive signals from other IC chips. The other group of circuits, comprising the remainder of the chip (i.e., the portion of the chip not dedicated to buffers) is generally called the "core" or "core logic".

"Fail safe" buffers are buffers that present a high impedance to a line to which they are connected (e.g., a telephone line) even when power to the buffer, generally referred to as VDD, is not present. However, many prior art fail-safe buffer designs assume that a single voltage source powers both the buffer and the core logic of the IC chip. Since many new ICs are using separate voltages for the buffers and the chip cores to save on power, it is possible that the chip core power supply may not be present while the buffer power supply is still on. This lack of power to the core logic can cause the buffer to be in a low impedance state, negating the fail-safe nature of the chip.

FIG. 1 illustrates a prior art open collector buffer as an example of a 5 volt tolerant output buffer manufactured in 3.3 volt technology (i.e., designed to tolerate a gate-source voltage or gate-drain voltage of approximately 3.3 volts). The circuit of FIG. 1 includes an inverter 10 comprising transistors 12 and 14. Inverter 10 also includes an input node 16 and an output node 18. Coupled to output node 18 is a pull-down stage 20 comprising transistors 21 and 22. Transistor 21 is connected to pad 30 via transistor 22. The inverter 10 drives output node 18, which in turn drives the gate of transistor 21. Thus, when input node 16 is high, output node 18 is low and transistor 21 is off. An external resistor (not shown) which is connected between the pad and a power supply in a conventional manner pulls the pad 30 to a high voltage. If, however, input node 16 is low, output node 18 will be high, turning on transistor 21 and pulling pad 30 to a low voltage, since the conductance of the transistors 21 and 22 is much greater than that of the external pull up resistor.

Transistor 22 protects the circuit of FIG. 1 against voltages that can cause reliability problems. The gate of transistor 22 is permanently connected to a 3.3 volt power supply, VDD. Thus, when input node 16 is high, and a 5 volt signal is present on pad 30, transistor 22 acts as a source follower so that the voltage on node 24 cannot go above VDD–VTH$_{22}$, where VTH$_{22}$ is the threshold voltage of transistor 22 (typically about 1 volt). Thus, node 24 will not go above 2 volts, and therefore both transistors 22 and 21 meet the reliability criteria (i.e., they do not carry voltages that exceed the 3.3 volt limitation).

The circuit of FIG. 1 is 5 volt tolerant as long as VDD is present. However, if VDD is not present, the full 5 volts will be applied across the gate of transistor 22, since VDD would be zero. Thus, the circuit of FIG. 1 is not a fail-safe buffer.

FIG. 2 illustrates a modification to the circuit of FIG. 1 which makes the circuit a fail-safe open collector output buffer. The circuit of FIG. 2 is identical to that of FIG. 1, with one exception. Rather than connecting the gate of transistor 22 to VDD, in the FIG. 2 configuration, the gate of transistor 22 is connected to a reference voltage 26. Both the circuit of FIG. 2 and specific details regarding a reference voltage generator utilized to generate reference voltage 26 are the subject of commonly assigned co-pending patent application Ser. Nos. 09/069,049 and 09/067,818, both of which are incorporated herein by reference.

The circuit of FIG. 2 operates as follows. When VDD is present, the voltage at reference voltage node 26 is equal to VDD. However, if VDD is not present, and a high voltage is applied to the pad 30, the reference voltage 26 is dropped to approximately half of the voltage applied to pad 30. Thus, if 5 volts is applied to the pad 30, reference voltage 26 will be 2.5 volts. Therefore, the voltage across the gate of transistor 22 will also be 2.5 volts and the source-drain voltage of transistor 22 will be approximately 3.5 volts, even when VDD is not present.

Since, as noted above, many new ICs are using a lower voltage for the chip core than for the buffers to save on power, it is possible that the chip core power supply may not be present while the buffer power supply, VDD, is still on. In the circuit of FIG. 2, this condition will mean that node 16, which comes from the chip core, is low. This turns transistor 21 on, causing the output, node 30, to go low, which will cause the circuit to sink a large current, defeating the purpose of a fail-safe buffer.

SUMMARY OF THE INVENTION

According to the present invention, a buffer portion of an IC chip operates from a power supply different from the power supply that powers the core logic; however, the buffer remains in a high impendence state, regardless of whether or not power is supplied to the core logic.

This is accomplished by constructing an integrated circuit (IC) having a buffer receiving power from a first power supply and core logic receiving power from a second power supply, and including in the IC a core-voltage blocking circuit coupled to the second power supply, wherein the output of the IC is in a high impedance state when the second power supply is not applied to the core logic.

DETAILED DESCRIPTION OF THE PREFERRED EMBODIMENTS

For the purpose of this application, the term "high impedance state" is defined as a state in which a device (i.e., a buffer) has a high enough impedance presented to the line so that it does not draw more than a very small current. Ideally, it will not draw any current, but a current of 10 to 20 micro amps being drawn is still considered a "high impedance state." The term "low impedance state" is defined herein would ideally be zero ohms, but would also include an impedance of up to 100 ohms. The term "normal state" or "normal operation" is defined as the state in which there is no high voltage applied externally to the circuit's output, and it is driving output voltages between 0 (low state) and VDD (high state).

Figure 1:
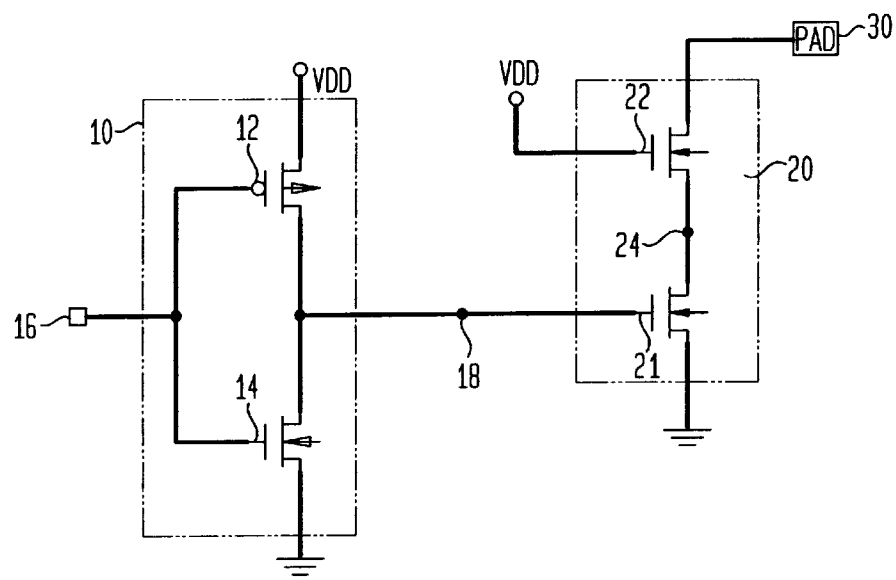
FIG. 1 illustrates a 5-volt-tolerant collector output buffer in accordance with the prior art.
Figure 2:
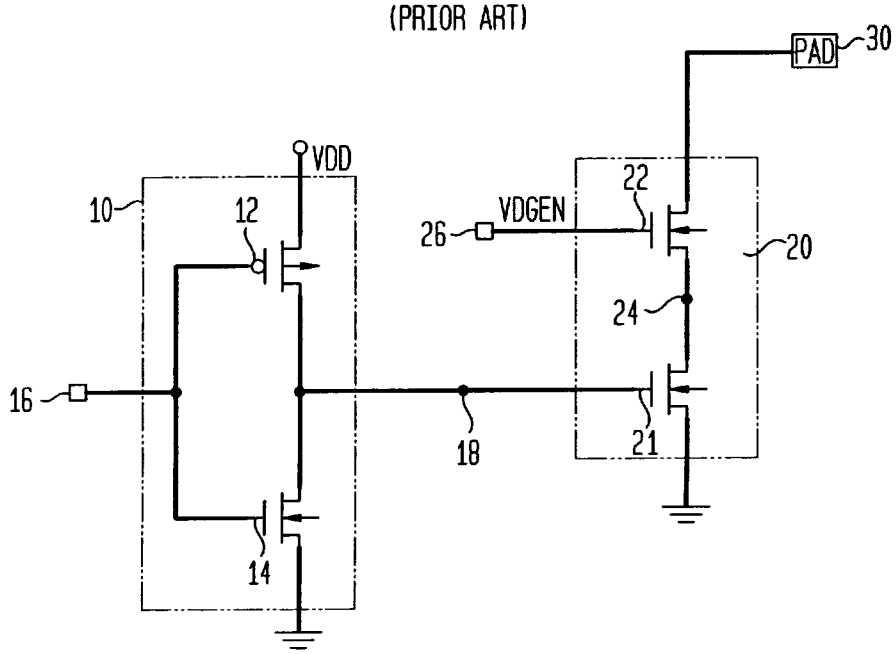
FIG. 2 illustrates a known improvement to the circuit of FIG. 1.
Figure 3:
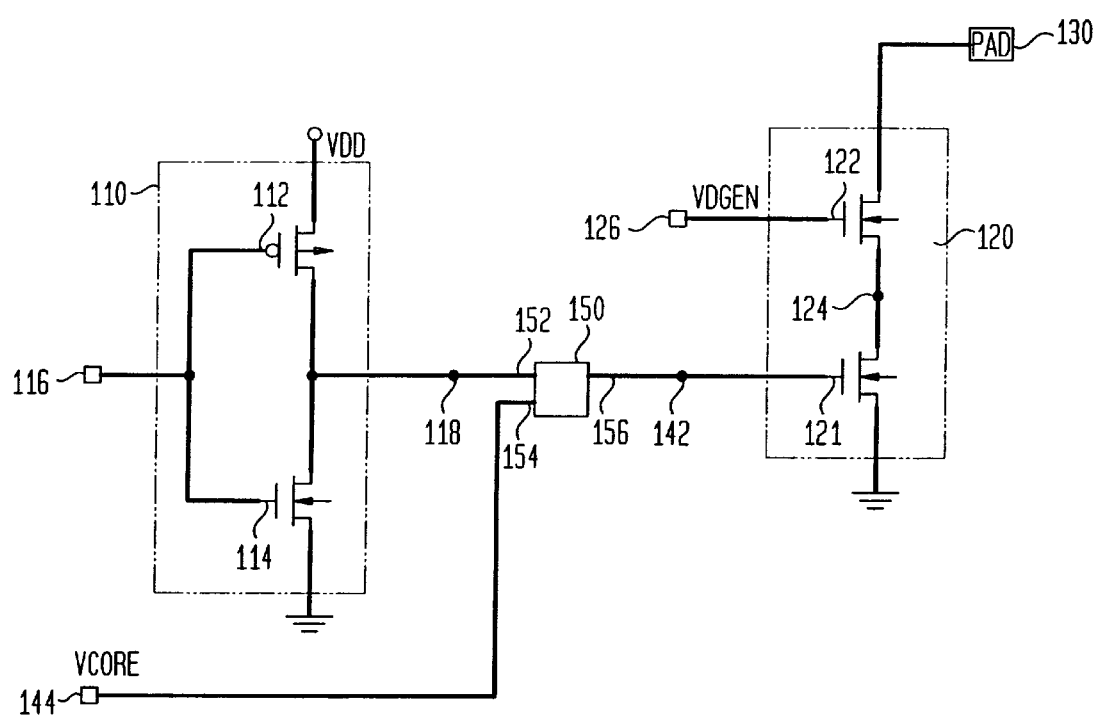
FIG. 3 illustrates a fail-safe buffer in accordance with the present invention.

FIG. 3 illustrates a fail-safe buffer circuit in accordance with the present invention. As shown in FIG. 3, an inverter 110 comprises transistors 112 and 114 having an input node 116 and driving an output node 118. Output node 118 is connected to a first input 152 of a core voltage blocking circuit 150. A second input node 154 of core voltage blocking circuit 150 receives a core voltage VCORE from a core voltage power supply (not shown) via node 144. An output 156 of core voltage blocking circuit 150 drives node 142, which is connected to the gate of transistor 121 of the pull-down stage 120. This circuit is essentially identical to the circuit of FIG. 2, except for the insertion of core voltage block circuit 150 between inverter 110 and pull-down stage 120.

Figure 4:
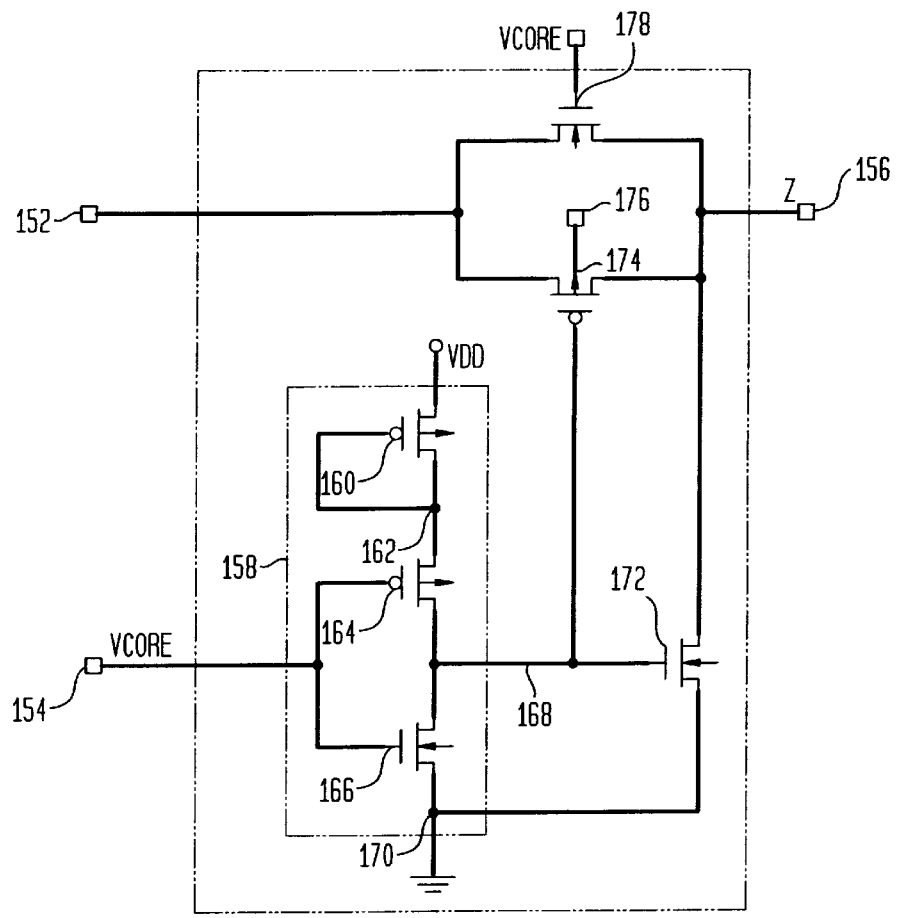
FIG. 4 is a circuit diagram of a core voltage blocking circuit in accordance with the present invention.

FIG. 4 is circuit diagram of an example of a core voltage blocking circuit 150 of FIG. 3 in accordance with the present invention. An inverter 158 comprises transistor 160 connected as a diode in series with transistors 164 and 166. An output node 168 of inverter 158 is connected to the gate of transistor 172 and also to the gate of transistor 174. Transistors 174 and 178 are connected to form a transmission gate ("T-gate"). The back gate of transistor 174 terminates at output node 176, which, utilizing a known floating-well generator circuit 179 illustrated in FIG. 5 (described in more detail below), automatically sets output node 176 equal to the greater of VDD and the core power supply voltage VCORE. P-channel transistors 180 and 182 are connected such that the common node between them, output node 176, is the value of the greater of VDD and the core power supply voltage.

Figure 5:
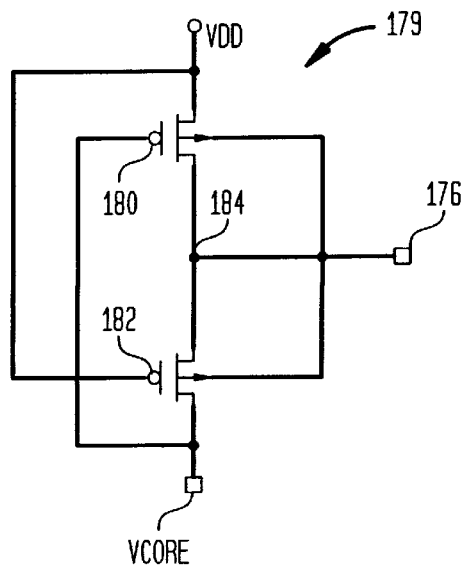
FIG. 5 illustrates a prior art floating well generator circuit.

The operation of this embodiment is described with reference to FIGS. 3–5. If VCORE is present at input node 154, it will turn on the T-gate made by transistors 174 and 178 and floating-well generator circuit 179, and turn off transistor 172. This essentially nullifies the effect of core voltage blocking circuit 150, letting the entire circuit perform as usual, i.e., the circuit of FIG. 3 operates like the circuit of FIG. 2 if VCORE is present at input node 154. However, if VCORE is not present at input node 154, the T-gate will be off and transistor 172 will be turned on by the inverter 158. This pulls the output 156 of core voltage blocking circuit 150 low, regardless of the value of its input. This ensures that the output to the pad 130 of FIG. 3 is in the high impedance state since the gate of transistor 121, node 124, is held low.

The purpose of the diode connected transistor 160 of FIG. 4 is to ensure that no DC power is drawn by the inverter 158 when VCORE is high. If transistor 160 were not present, and VDD=3.3 volts and VCORE=2.5 volts, a voltage of 3.3-2.5=0.8 volts would be present across the gate-source of transistor 164. This could cause significant leakage current. The addition of transistor 160 ensures that this leakage does not happen, since the gatesource voltage across 164 is now (VDD-VCORE)-Vth$_{160}$, where Vth$_{160}$ is the threshold voltage of transistor 160, typically 0.8 volts.

It is also possible that the power supply VCORE may be present while VDD is not present. This could mean that a 2.5 volt signal is present on input node 152 while VDD=0. If the backgate connection of transistor 174 were connected to VDD, as is usually done, this would result in the parasitic diode from input node 152 to VDD being forward biased. This will consume DC power and may cause reliability problems. This problem is solved by the circuit of FIG. 5, which operates as follows: In normal operations VDD=3.3 volts and VCORE=2.5 volts. This means that transistor 180 is on and transistor 182 is off, which connects node 176 to VDD through transistor 180. However, if VDD is not present, and VCORE is 2.5 volts, transistor 182 will be on and transistor 180 will be off. This connects node 176 to VCORE. Thus, node 176 will always be at the most positive potential, ensuring that the parasitic diode of transistor 174 will not turn on.

An important problem that must be overcome when running a core at 2.5 volts with buffers at 3.3 volts is the need to translate the lower voltage up to the higher voltage at high speeds, and without causing any DC power consumption. As mentioned previously, one way to do this is by adding a diode in series with the P-channel transistor of an inverter as shown in FIG. 4. This works well for the circuit of FIG. 4, which is only used to detect the presence or absence of the power supply voltage VCORE, which cannot change very quickly. This circuit is undesirable, however, for normal data paths, which carry higher-speed signals. Typically, a power supply changes in a time ranging from milliseconds up to seconds, while a signal changes in nanoseconds.

Figure 6:
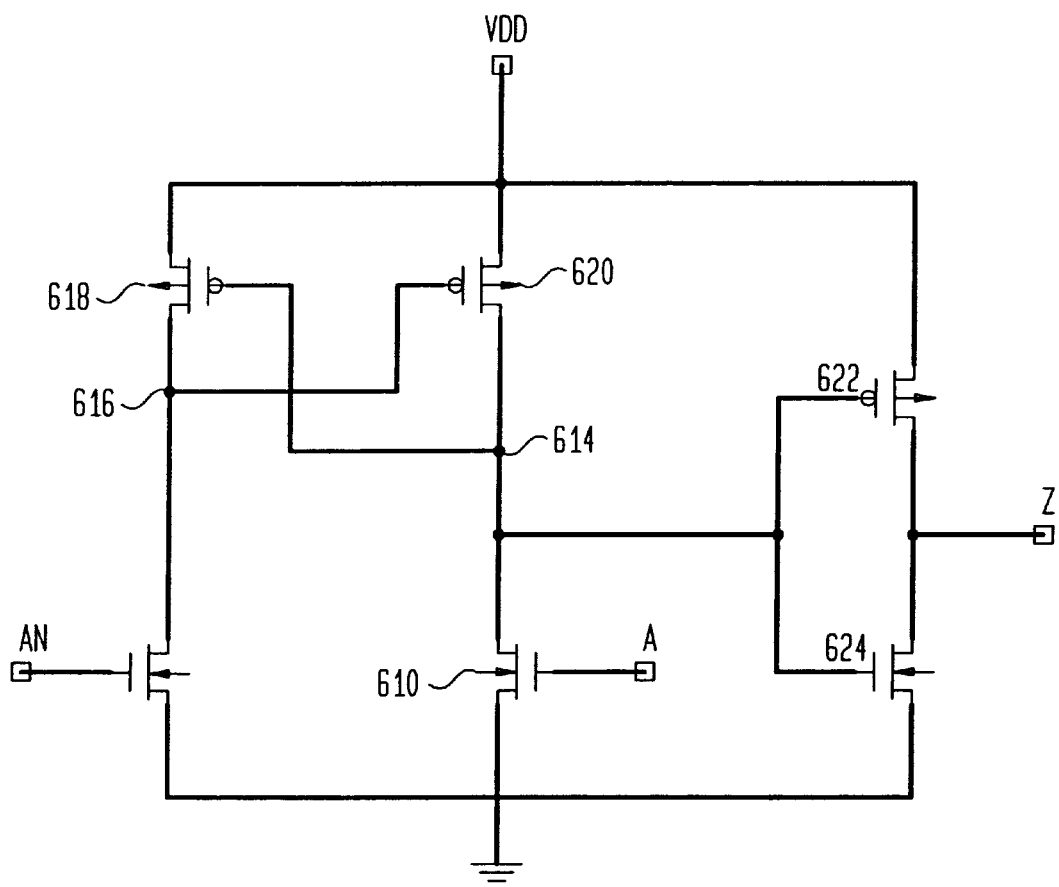
FIG. 6 illustrates a prior art voltage translator circuit.

An example of this problem is illustrated with reference to FIGS. 6 and 7. A standard circuit that is used to translate low voltages to higher voltages in fast data paths is shown in FIG. 6. In this circuit two data inputs, A and its complement AN, are the inputs from the low voltage core, e.g., VCORE of FIG. 5. Since they are connected only to N-channel transistors 610 and 612 as shown, their voltage values in the high state are not a problem. When A is high and AN is low, transistor 610 is on and transistor 612 is off. This pulls node 614 low, turning on transistor 618, which in turn pulls node 616 high, ensuring that transistor 620 remains off. The output Z will be high since node 614 is low. If A is low and AN is high, transistor 612 is on and transistor 614 is off. This pulls node 616 low, turning on transistor 620 which pulls node 614 high. The output Z is thus low.

The circuit of FIG. 6 has been found to work well, but it has a potential flaw with regard to fail-safe operation. If the core voltage VCORE fails during circuit operation while VDD is still present, both signals A and AN of FIG. 6 will be low. This turns off both transistors 610 and 612, causing the output Z to be latched into whatever state it was in when VCORE failed. Slight differences in leakage of the various transistors could change this state from one to the other, so it is impossible to tell what the final output would be. If the enable signal to a tri-statable fail-safe output buffer is latched in the wrong state, the buffer will be on when the system expects it to be in tri-state. This results in the buffer being in a low impedance state when the system was expecting a high impedance state. This could cause the system to crash, and possibly damage the chip due to very high currents.

Figure 7:
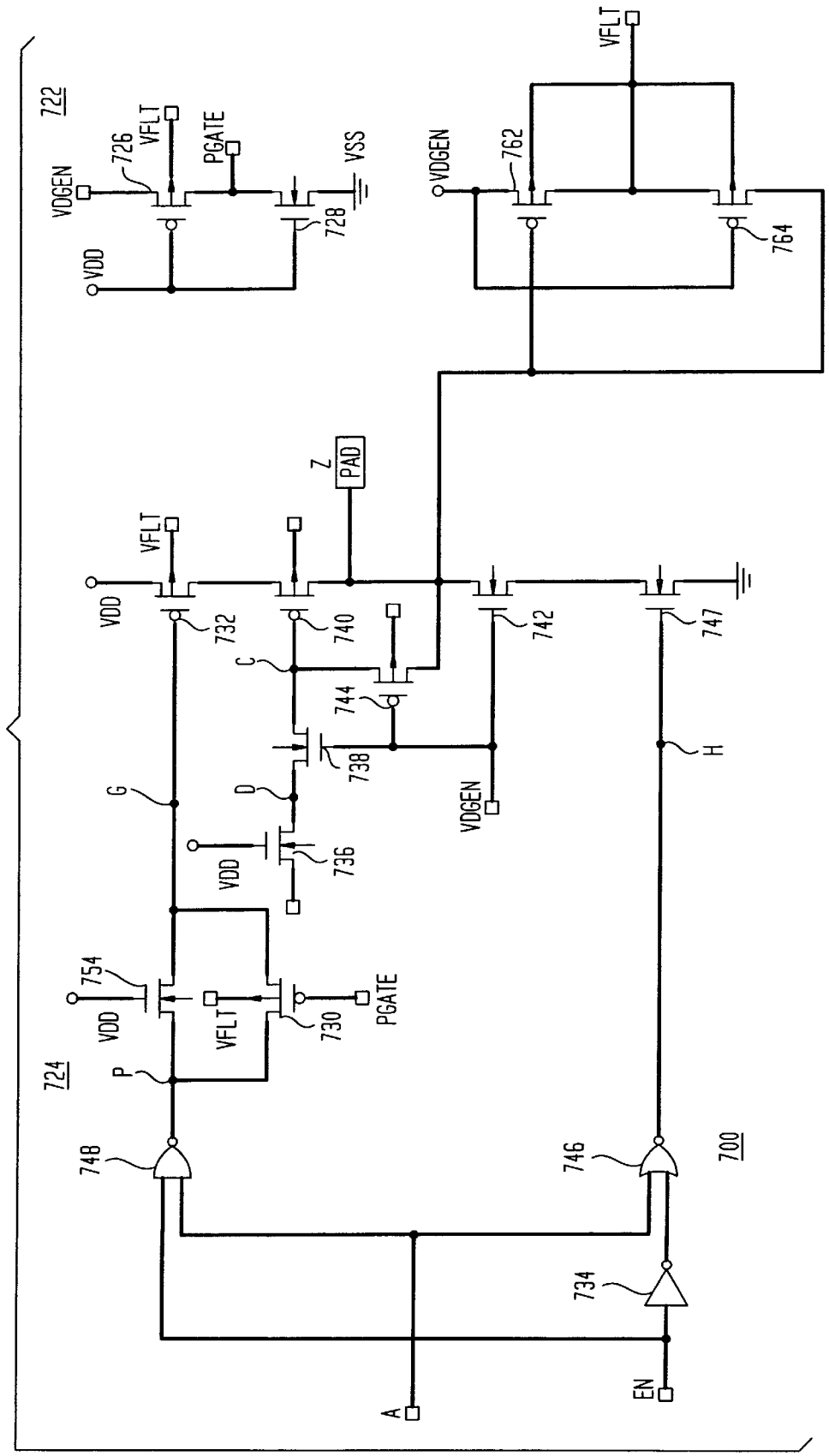
FIG. 7 illustrates a known tri-statable output buffer.

FIG. 7 illustrates a prior art tri-statable output buffer that is fail-safe when VDD is not present, or when VDD is present and the tri-state enable signal EN is high. This circuit is disclosed and described in detail in previously-mentioned commonly assigned U.S. patent application Ser. No. 09/069, 149. In the circuit of FIG. 7, if VDD is present, and the tri-state enable signal EN is high, node STN is low. Thus, nodes D and C will also be low, since transistors 738 and 736 will be turned on. This ensures that transistor 740 is on. The transmission gate formed by transistors 754 and 730 is also on, since node PGATE will be low as long as VDD is present. In this "normal operating mode" the NAND and NOR gates 748 and 746 control the output state of the circuit. As long as the tri-state enable signal EN is high, node H will be low and node G will be high, turning off both transistors 732 and 747, and thus putting the output into tri-state.

A problem arises in the circuit of FIG. 7, however, if node EN were to be low due to a failure of the VCORE power supply; the circuit would not be in tri-state, but rather would be in the active state, so that a potentially harmful contention situation would occur. A contention situation is one where one buffer connected to a bus line pulls the bus line high while another buffer on the same bus line pulls it low. This condition results in very high currents which can severely degrade the reliability of the system.

Figure 8:
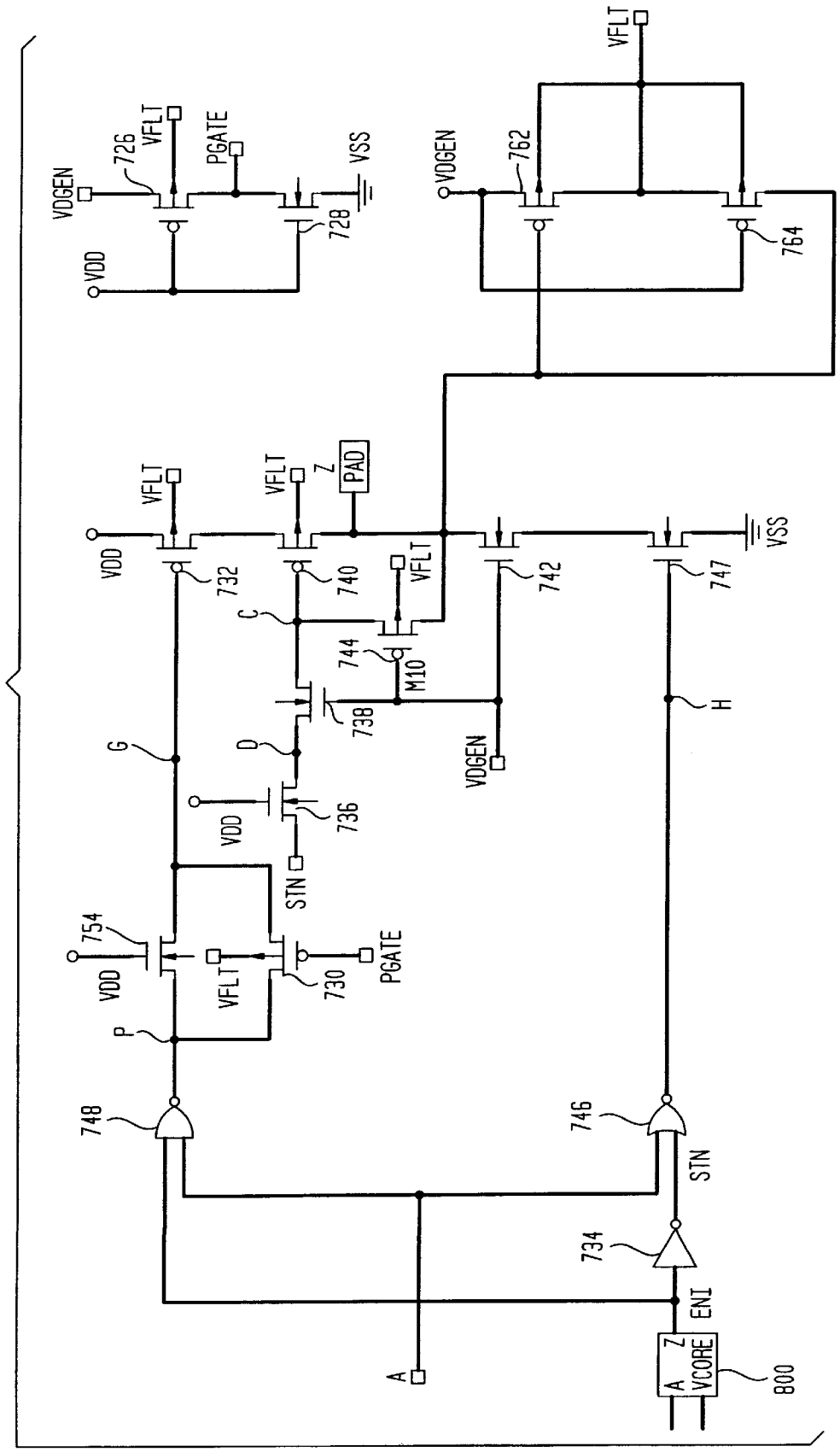
FIG. 8 illustrates an improvement over the circuit of FIG. 7, in accordance with the present invention.

FIG. 8 illustrates how the use of a core voltage blocking circuit in accordance with the present invention results in an improvement over the circuit of FIG. 7. In FIG. 8, a core voltage blocking circuit 800 such as that illustrated in FIG. 4 is added to the enable lead path in such a way that if VCORE fails, node H of FIG. 8 will be low and node G high, regardless of the latched state (high or low) of node EN i.e., this ensures that the FIG. 8 circuit is in tri-state. It is not necessary to add a core voltage blocking circuit to node A, since the latched state of node A does not affect the fail-safe aspect of the circuit.

While there has been described herein the principles of the invention, it is to be understood by those skilled in the art that this description is made only by way of example and not as a limitation to the scope of the invention. Accordingly, it is intended by the appended claims, to cover all modifications of the invention which fall within the true spirit and scope of the invention.

What is claimed is:

1. An integrated circuit (IC) having a buffer receiving power from a first power supply and core logic receiving power from a second power supply, comprising:
   a core-voltage blocking circuit coupled to said second power supply, wherein an output of said IC is in a high impedance state when said second power supply is not applied to said core logic.

2. An integrated circuit as set forth in claim 1, wherein said IC further comprises:
   a first inverter having an output coupled to said core-voltage blocking circuit; and
   a pull-down stage coupled between said core-voltage blocking circuit and said output of said IC.

3. An integrated circuit as set forth in claim 2, wherein said output of said IC is in a normal state when said second power supply is applied to said core logic.

4. An integrated circuit as set forth in claim 2, wherein said core-voltage blocking circuit comprises:
   a second inverter having an input connected to said second power supply;
   a transmission gate which is activated to pass a signal from the core logic to said output of said IC as long as the second power supply is applied to said core logic, but which is deactivated to disconnect the core logic from said output of said IC when the second power supply is not applied to said core logic; and
   a pull-down transistor which pulls down an output of said core-voltage blocking circuit when said transmission gate is deactivated.

5. An integrated circuit as set forth in claim 4, wherein said transmission gate comprises:
   a first transistor having a gate connected to said second power supply;
   a second transistor having a backgate and a gate, said gate being connected to said second inverter; and
   a floating-well generator having an input connected to said backgate.

6. An integrated circuit as set forth in claim 5, wherein said floating-well generator comprises:
   a third transistor having a gate connected to said second power supply and a drain connected to a floating-well generator output node; and
   a fourth transistor having a gate connected to said first power supply and a drain connected to said floating-well output node, wherein said floating-well output node is connected to said backgate of said second transistor.

7. An integrated circuit (IC) having a buffer receiving power from a first power supply and core logic receiving power from a second power supply, comprising:
   means for maintaining an output of said IC in either a high-impedance or normal state regardless of whether power is supplied from said second power supply to said core logic.

8. An integrated circuit as set forth in claim 7, wherein said means for maintaining comprises a core-voltage blocking circuit coupled to said second power supply, wherein said output of said IC is in a high impedance state when said second power supply is not applied to said core logic.

9. An integrated circuit as set forth in claim 8, wherein said core-voltage blocking circuit comprises:
   gate means for passing a signal from said core logic to said output of said IC as long as said second power supply is applied to said core logic, and for disconnecting said core logic from said output of said IC when said second power supply is not applied to said core logic; and
   pull-down means for pulling down the output of said core-voltage blocking circuit when said gate means disconnects said core logic from said IC.

10. An integrated circuit as set forth in claim 9, wherein said core voltage blocking circuit further comprises a first inverter having an input connected to said second power supply, and wherein said gate means comprises:
    a first transistor having a gate connected to said second power supply;
    a second transistor having a backgate and a gate, said gate being connected to said first inverter; and
    a floating-well generator having an input connected to said backgate.

11. An integrated circuit as set forth in claim 10, wherein said floating-well generator comprises:
    a third transistor having a gate connected to said second power supply and a drain connected to a floating-well generator output node; and
    a fourth transistor having a gate connected to said first power supply and a drain connected to said floating-well output node, wherein said floating-well output node is connected to said backgate of said second transistor.

12. A method of operating an IC having a buffer receiving power from a first power supply and core logic receiving power from a second power supply, comprising the steps of:
    passing a signal from said core logic to an output of said IC when said second power supply is supplying power to said core logic;
    blocking signals from said core logic to said output of said IC when said second power supply is not supplying power to said core logic; and
    pulling down the output of said core-voltage blocking circuit when said second power supply is not supplying power to said core logic.

* * * * *